United States Patent
Qiao et al.

(10) Patent No.: US 6,911,395 B1
(45) Date of Patent: Jun. 28, 2005

(54) METHOD OF MAKING BORDERLESS CONTACTS IN AN INTEGRATED CIRCUIT

(75) Inventors: Jiamin Qiao, Fremont, CA (US); Mira Ben-Tzur, Sunnyvale, CA (US); Prabhuram Gopalan, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1031 days.

(21) Appl. No.: 09/668,604

(22) Filed: Sep. 22, 2000

Related U.S. Application Data
(60) Provisional application No. 60/155,752, filed on Sep. 23, 1999.

(51) Int. Cl.[7] .............................................. H01L 21/302

(52) U.S. Cl. ...................... 438/689; 438/700; 438/704; 438/710; 438/720; 438/724

(58) Field of Search ................................. 438/689, 700, 438/704, 710, 720, 724

(56) References Cited

U.S. PATENT DOCUMENTS

| | | | | |
|---|---|---|---|---|
| 5,604,374 A | * | 2/1997 | Inou et al. | 257/593 |
| 5,840,624 A | * | 11/1998 | Jang et al. | 438/624 |
| 6,136,682 A | * | 10/2000 | Hegde et al. | 438/622 |
| 6,255,700 B1 | * | 7/2001 | Yoshida et al. | 257/380 |
| 6,406,987 B1 | * | 6/2002 | Huang | 438/595 |
| 6,448,140 B1 | * | 9/2002 | Liaw | 438/279 |

* cited by examiner

*Primary Examiner*—Nadine G. Norton
*Assistant Examiner*—Binh X. Tran
(74) *Attorney, Agent, or Firm*—Bradley T. Sako

(57) ABSTRACT

According to one embodiment (100), a method of forming borderless contacts may include forming a composite layer over a first insulating layer (102). A contact hole may be formed through a composite layer and a first insulating layer (104). A conducting layer may then be formed (106), including within a contact hole. Portions of a conducting layer may then be removed with a composite layer as a polish stop (108), and a contact structure may be formed. A first interconnect structure and a second insulating layer may then be formed over a first insulating layer (110 and 112). A borderless contact pattern may then be etched with a composite layer as an etch stop (114).

17 Claims, 12 Drawing Sheets

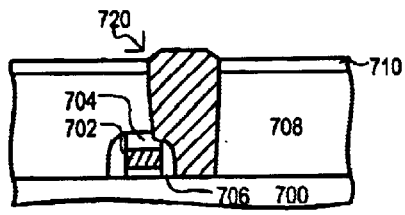
FIG. 7G (BACKGROUND ART)
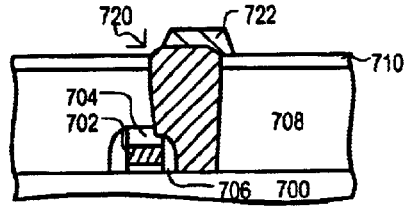
FIG. 7H (BACKGROUND ART)
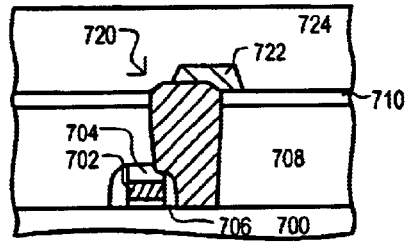
FIG. 7I (BACKGROUND ART)
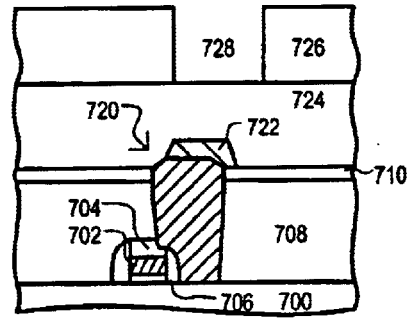
FIG. 7J (BACKGROUND ART)
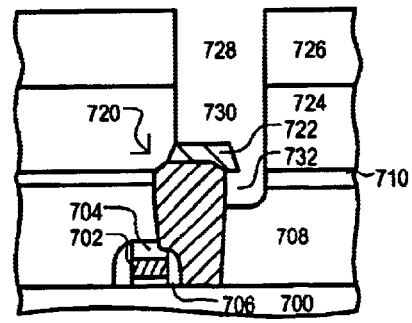
FIG. 7K (BACKGROUND)

US 6,911,395 B1

METHOD OF MAKING BORDERLESS CONTACTS IN AN INTEGRATED CIRCUIT

This application claims benefit of provisional 60/155,752 filed Sep. 23, 1999.

TECHNICAL FIELD

The present invention relates generally to the fabrication of integrated circuits, and more particularly the formation of contacts in an integrated circuit.

BACKGROUND OF THE INVENTION

Many types of integrated circuits are fabricated using layers of conductive, semiconductive, and/or insulating materials. For example, an integrated circuit may include a substrate in which a number of active devices (such as transistors) are formed. Such active devices may be connected to one another by one or more conductive or semiconductive layers (referred to herein as "conducting layers"). The interconnecting conducting layers may be separated from one another by insulating layers. Insulating and conducting layers are typically deposited according to a predetermined deposition "recipe" which may define the various materials, conditions and environment used to deposit a layer. Recipes may also be used to etch or pattern an insulating or conducting layer. For example, an etch recipe may be used to form contact holes in an insulating layer, while another set of recipes may be used to pattern a conducting layer.

A conducting layer may be formed from a single conductive (or semiconductive) material. In addition, a conducting layer may also be a composite of one or more conductive (or semiconductive) materials. As just a few examples, a conducting layer may include a first layer of conventionally doped polycrystalline silicon (polysilicon) and a second layer of "silicide" (silicon-metal alloy). Alternatively, a conducting layer can include one or more metal layers and/or alloys. As just a few examples, a conducting layer can include aluminum, copper, or more complex arrangements, such as a titanium(Ti)-tungsten(W) alloy layered onto bulk aluminum, with an underlying barrier layer comprising Ti, Ti-nitride (TiN), or a Ti alloy.

Similarly, an insulating layer may be formed from a single material or a composite of materials. As just one example, an insulating layer may include a "doped" silicon dioxide ("oxide") and/or an "undoped" silicon oxide. The doped silicon oxide can include dopant elements, such as boron and phosphorous, while the undoped silicon oxide will be essentially free of dopant elements.

An insulating layer may perform a variety of functions in an integrated circuit. For example, an insulating layer may serve to electrically isolate one conducting layer or structure from another. Further, an insulating layer may serve as the surface on which subsequent layers are formed and patterned. Therefore, in many cases it may desirable for an insulating layer to provide a relatively planar surface.

Different conducting layers may be connected to one another and/or to a substrate by contacts and/or vias. Contacts and/or vias can include contact holes that extend through one or more insulating layers. Conventionally, a contact may connect a substrate to a conducting layer, while a via may connect two different conducting layers to one another.

A conventional way of forming a contact hole in one or more insulating layers may include lithography and etch steps. Lithography can be used to form a pattern over an insulating layer (that includes the location of contact holes). An etch step can transfer the pattern onto one or more lower situated insulating layers.

One concern with certain contact structures can be the alignment of a contact with a lower conducting layer. Because a contact is usually formed by etching a hole through an insulating layer to an underlying conducting layer, it is desirable for the etched hole to be situated directly over the desired contact location in the lower conducting layer. To make the alignment of a contact with an underlying conducting layer easier, an underlying conducting layer can be formed with "borders" (also referred to as landings). A border can be a wider portion in a conducting line that provides a larger area to align a contact with. Borders may thus be used to compensate for alignment errors between a lower conducting layer and a contact hole.

A drawback to borders in conductive patterns is the increased area that such structures may require. Line pitches may have to be increased and/or the layout of conductive patterns with borders may be more complex.

One approach to reducing the area of a contact and/or via is a "borderless contact." A borderless contact may provide a conductive connection between two different conducting layers without a border structure.

A conventional borderless contact may be formed by one or more etch steps that may define an interconnect pattern in an insulating layer. Conducting material(s) may then be deposited into the etched pattern. Portions of a conducting material on a surface of the insulating material may be removed, leaving conducting material(s) in an interconnect pattern etched within an insulating layer.

Another type of contact that may compensate for alignment errors is a "self-aligned" contact (SAC). A self-aligned contact may include a lower conducting structure (such as a transistor gate) that includes a top insulating layer and a side insulating layer (such as a "sidewall"). With such an arrangement, a contact hole can be etched without a minimum spacing requirement with respect to the lower conducting structure.

After a conducting layer has been deposited to form a contact or via, it may be desirable to remove portions of the deposited layer. As just two examples, the conducting layer may be etched back or polished back. One way to improve the controllability of such removal process is to form a "stop" layer. Compared with a layer that is being removed, a stop layer may have a slower removal rate.

Borderless contacts and/or self-aligned contacts/vias may increase the density of an integrated circuit. However, integrating particular self-aligned contacts methods into the same manufacturing process as borderless contacts may result in some drawbacks. One example of such a drawback will be described with respect to a manufacturing process shown in FIGS. 7A to 7J.

FIG. 7A shows a side-cross sectional view of a substrate 700 on which a conducting structure 702 may be formed. A top insulating structure 704 and a side insulating structure 706 may be formed over a conducting structure 702. In the particular arrangement of FIG. 7A, a conducting structure 702 may include the gate of an insulated gate field effect transistor (IGFET).

In FIG. 7B a first insulating layer 708 has been formed over a conducting structure 702 and a substrate 700. In FIG. 7C, a second insulating layer 710 has been formed over the first insulating layer 708. A first insulating layer 708, as just one example, may include doped silicon dioxide. A second insulating layer 710, as just one example, may include undoped silicon dioxide.

As shown in FIG. 7D, a second insulating layer 710 may be patterned with a lithography and etch step. A layer of photoresist 712 may be formed over a second insulating layer 710. A pattern may be developed in a layer of photoresist 712 that includes a contact mask opening 714 at contact hole locations.

A photoresist layer 712 may be removed, to form a "hard" etch mask in a second insulating layer 710. A self-aligned contact etch may form a self-aligned contact hole 716 through a first insulating layer 708. A structure following such a step is shown in FIG. 7E.

FIG. 7F shows a self-aligned contact hole following a deposition of a first conducting material 718 into a self-aligned contact hole 716.

FIG. 7G shows a contact structure following a step that removes a portion of a first conducting material 718 to form a contact structure 720. Such a removal step may include chemical mechanical polishing (CMP). A second insulating layer 710 may be a CMP stop layer that may prevents the over-polishing of a resulting contact structure. Thus, in the particular arrangement illustrated by FIGS. 7A–7K, a second insulating layer 710 may be a hard mask and a CMP stop layer.

As shown in FIG. 7H, a first interconnect structure 722 may be formed over a second insulating layer 710. A first interconnect structure 722 may make ohmic contact with a contact structure 720. A first interconnect structure 722 may be formed by depositing a conducting layer, and then patterning such a layer with conventional photolithographic and etch steps.

Referring now to FIG. 7I, a third insulating layer 724 may be deposited over a first interconnect structure 722 and resulting contact structure 720.

A third insulating layer 724 may be etched according to a borderless contact etch mask 726 to form pattern openings 730 in a third insulating layer 724. An integrated circuit structure following a first borderless contact etch is shown FIG. 7K–A third insulating layer 724, as just one example, may include undoped silicon dioxide.

FIG. 7K also shows a drawback associated that may be associated the approach of FIGS. 7A–7K. In particular, in the event there is no substantial selectivity between a first, second and third insulating layer (708, 710 and 724), contact/via overetch, shown by overetch portion 730, may occur.

SUMMARY OF THE INVENTION

According to the disclosed embodiments of the invention, methods and structures for forming an integrated circuit contact and/or via structure may include forming an insulating layer that can serve as a removal stop for a conducting material in the formation of a first contact or via. Such an insulating layer may also form an etch stop for a subsequently formed borderless contact pattern.

According to one aspect of the disclosed embodiments, an insulating layer may form a self-aligned contact hard etch mask and an etch stop for a subsequently formed borderless contact pattern.

According to another aspect of the disclosed embodiments, an insulating layer may form a self-aligned contact hard etch mask, a removal stop for a conducting material in the formation of a first contact or via, and an etch stop for a subsequently formed borderless contact pattern.

According to another aspect of the disclosed embodiments, an insulating layer may be a capping layer for a lower insulating layer and form an etch stop for a subsequently formed contact or via hole.

According to another aspect of the disclosed embodiment, an integrated circuit may include a first insulating layer, and a second insulating layer formed over the first insulating layer. The second insulating layer may be a composite of two insulating materials, and form a removal stop for a conducting material in the formation of a first contact or via and an etch stop for a subsequently formed borderless contact pattern.

BRIEF DESCRIPTION OF THE DRAWINGS

FIGS. 7A–7K are side cross-sectional views of a conventional integrated circuit fabrication approach that may result in an overetched borderless contact pattern.

DETAILED DESCRIPTION OF THE EMBODIMENTS

Various embodiments will now be described in conjunction with a number of charts and diagrams. The embodiments set forth approaches to forming an integrated circuit that may include a "stop" layer for a borderless contact etch. Such a stop layer may also form one or more of the following: a stop layer for a lower contact structure, a "hard" contact etch mask for a lower contact structure, or a "cap" layer for a lower insulating layer.

Figure 1:
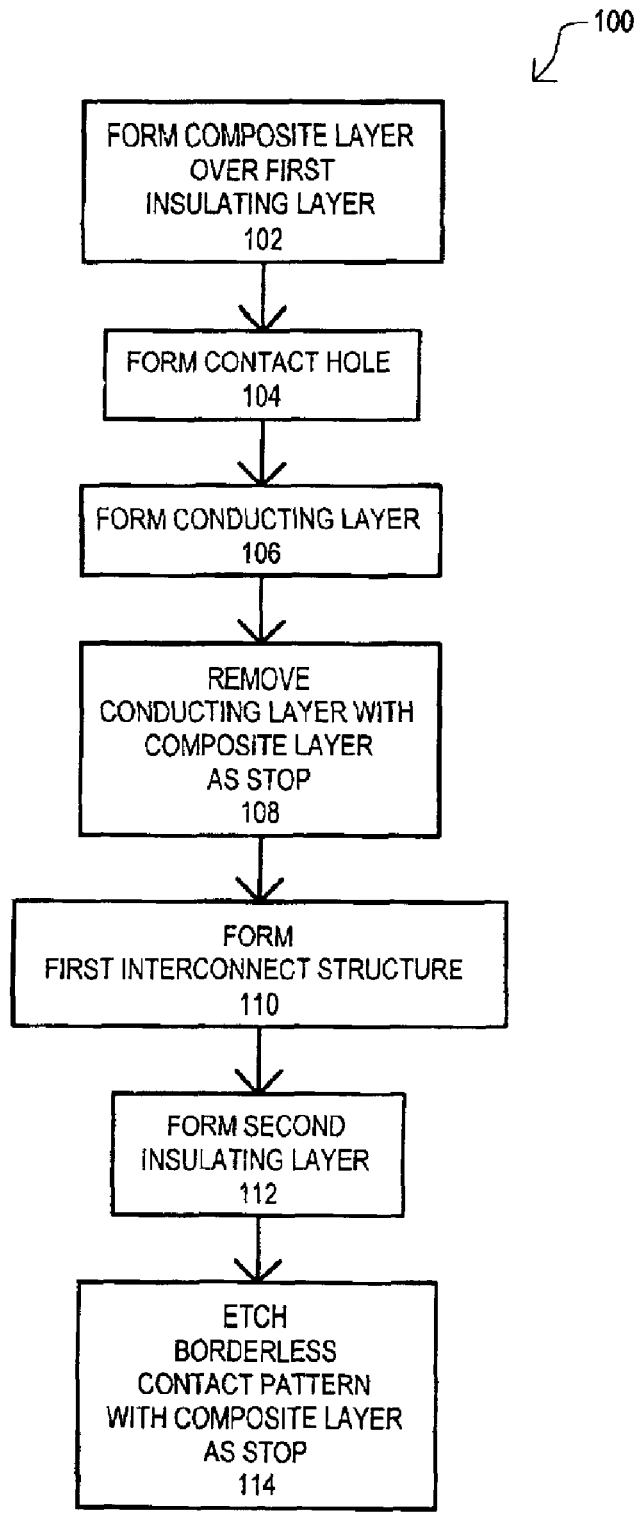
FIG. 1 is a flow diagram of a first embodiment.

Referring now to FIG. 1, a flow chart shows steps in a manufacturing process according to a first embodiment. FIGS. 2A to 2G are side cross sectional views illustrating various steps of the first embodiment. A first embodiment method is designated by the general reference character 100, and is show to include a step 102 of forming a composite layer over a first insulating layer.

Figure 2A:
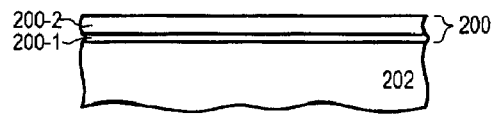
FIGS. 2A–2G are side cross sectional views of an integrated circuit formed according to the first embodiment.

A portion of an integrated circuit following a step 102 is shown in FIG. 2A. A composite layer 200 may be formed on a first insulating layer 202. A composite layer 200 may include at least two materials that have different responses to an applied etch. In particular, a composite layer 200 may include a first composite material 200-1 and a second composite material 200-2. When a particular etch is applied to a composite layer 200, a first composite material 200-1 may etch at a slower rate than a second composite material 200-2 (or vice versa).

It is understood that while the various embodiments may refer to insulating and/or conducting layers as a "first" such layers, such a term should not be construed as being limited to a first layer formed in a manufacturing process. Other layers may be formed below and/or prior to a "first" layer. Along these same lines, while an insulating or conducting layer may be referred to as a subsequent (e.g., "second," "third" etc.) such layer, other layers may be formed between a first layer and a subsequent such layer.

Figure 2B:
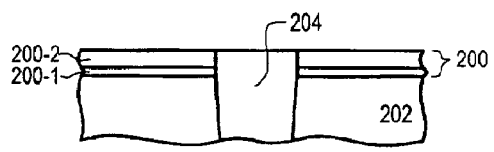

A first embodiment 100 may continue by forming a contact hole (step 104). As shown in FIG. 2B, a contact hole 204 may extend through a composite layer 200 and a first insulating layer 202. A contact hole 204 may expose a lower conducting layer (not shown), such as an interconnect layer or a substrate. Such a lower conducting layer may include conductive and/or semiconductive materials.

It is understood that a "contact" hole may also refer to a hole formed for a contact or via. As just two examples, a contact hole may be formed between a substrate and an interconnect layer or between two interconnect layers.

Figure 2C:
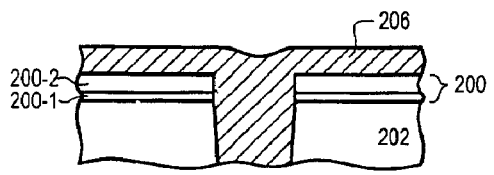

Once a contact hole 204 has been opened, a conducting layer may be formed (step 106). As shown in FIG. 2C, a conducting layer 206 may fill a contact hole 204, and may also be formed over a composite layer 200.

Figure 2D:
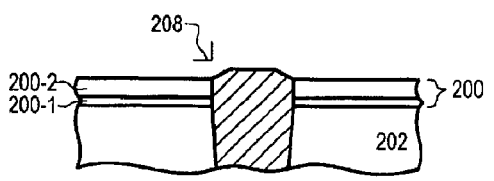

As shown in FIG. 1, the first embodiment 100 may continue with a step that removes a conducting layer with a composite layer as a stop (step 108). Such a removal step 108 may include, as just two examples, an etch back step or more preferably, a chemical-mechanical polishing step. An integrated circuit following a step 108 is shown in FIG. 2D. Portions of a conducting layer 206 have been removed, exposing a composite layer 200 and forming a contact structure 208.

Figure 2E:
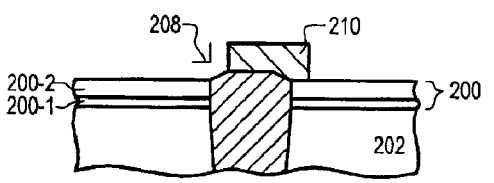

A first interconnect structure may then be formed (step 110). As shown in FIG. 2E, a first interconnect structure 210 may be formed on, and make contact with, a contact structure 208. In the particular example of FIG. 2E, a first interconnect structure 210 is offset with respect to a contact structure 208.

Figure 2F:
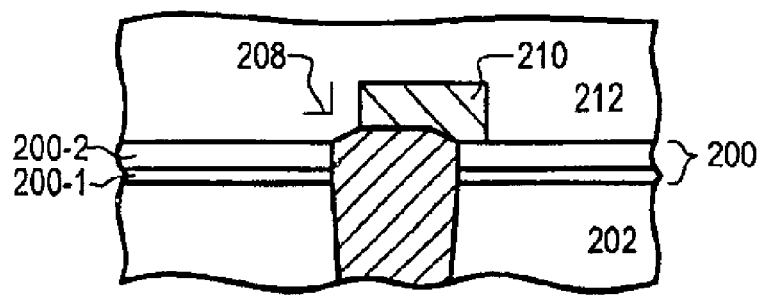

As shown by step 112 and FIG. 2F, a second insulating layer 212 may be deposited over a contact first interconnect structure 210 and a composite layer 200.

Figure 2G:
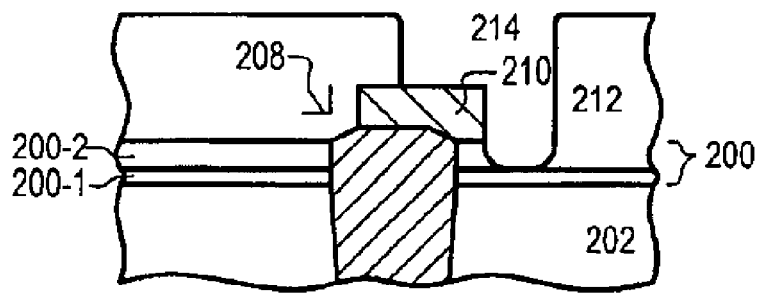

A borderless contact pattern may then be etched through a second insulating layer 212 with a composite layer 200 as an etch stop (step 114). As shown in FIG. 2G, a borderless contact pattern 214 may expose a first interconnect structure 210. In the particular arrangement of FIG. 2G, a first composite material 200-1 in composite layer 200 may serve as an etch stop, etching at a slower rate than a second insulating layer 212.

In this way, a composite layer 200 may serve as a conducting material removal stop, and as a borderless contact pattern etch stop.

Figure 3:
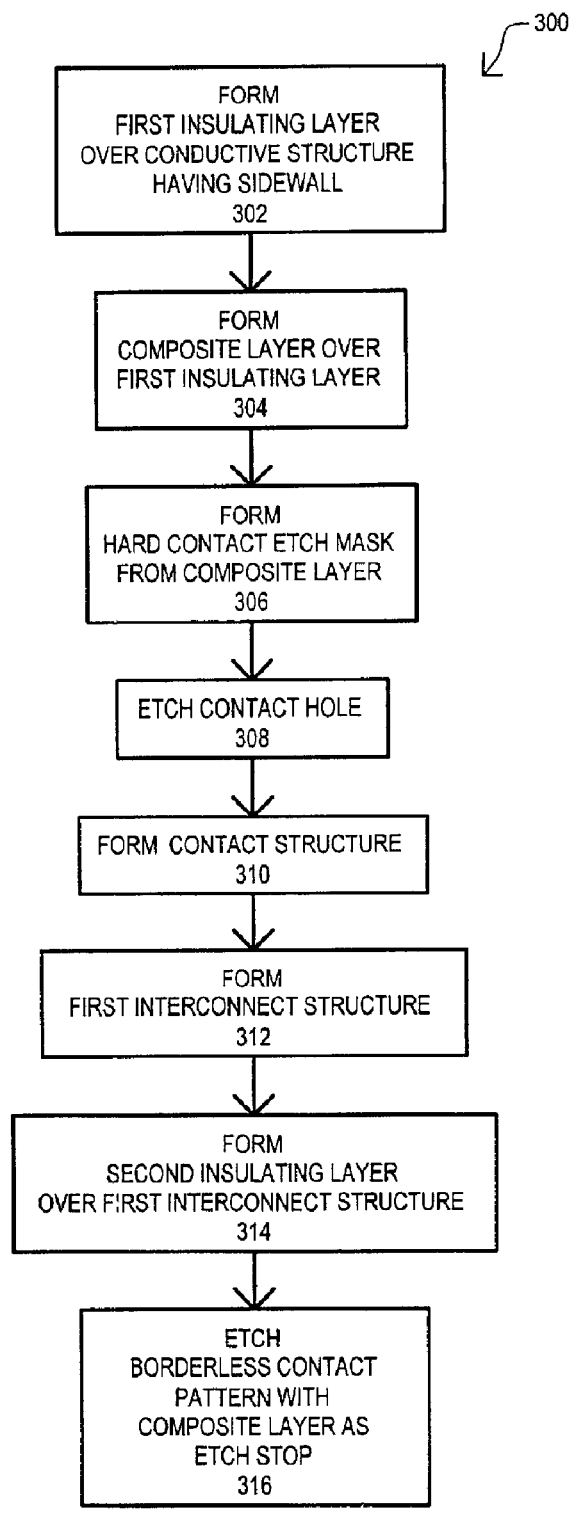
FIG. 3 is a flow diagram of a second embodiment.

FIG. 3 is a flow diagram of a second embodiment. FIGS. 4A–4H are side cross sectional views of an integrated circuit manufactured according to a second embodiment.

Figure 4A:
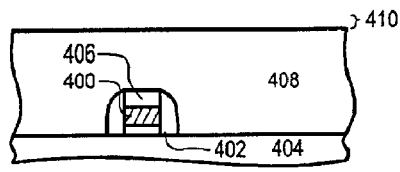
FIGS. 4A–4H are side cross sectional views of an integrated circuit formed according to the second embodiment.

The second embodiment is designated by the general reference character 300 and may include forming a first insulating layer over a conductive structure with a sidewall (step 302). An integrated circuit following a step 302 is shown in FIG. 4A. A conductive structure 400 having an insulating sidewall 402 may be formed on a substrate 404. In the particular arrangement of FIG. 4A, a conductive structure may include a top insulating structure 406. A first insulating layer 408 may be formed over the conductive structure 400.

Figure 4B:
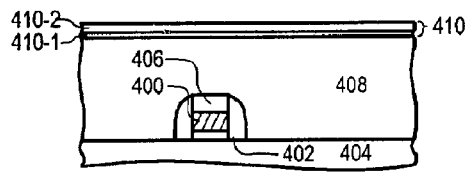
Figure 4C:
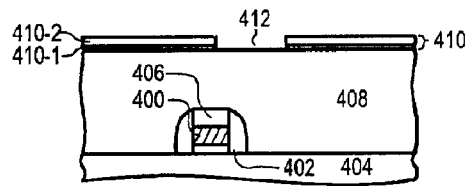

A step 304 may include forming a composite layer over a first insulating layer. A resulting structure is shown in FIG. 4B. A composite layer 410 may be situated over first insulating layer 408. In one arrangement, a composite layer 410 may have the same general structure as composite layer 200 of FIGS. 2A–2G, including a first composite material 410-1 and a second composite material 410-2. First composite material 410-1 may have a different response to an applied etch than second composite material 410-2.

A second embodiment 300 may continue by forming a "hard" contact etch mask out of a composite layer (step 306). A "hard" etch contact etch may be an etch mask formed from an integrated circuit material, rather than a layer of developed photoresist. A hard contact etch mask may include a hard etch mask opening 412 in a location where a contact may be formed.

Figure 4D:
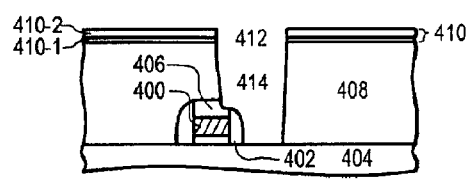

Once a hard contact etch mask is formed, a contact hole may be etched (step 308). An integrated circuit following a step 308 is illustrated in FIG. 4D. A contact hole etch may remove a portion of a first insulating layer 408 that is exposed by a hard etch mask opening 412 and form a contact hole 414 therein. In the particular arrangement of FIG. 4D, a self-aligned contact to substrate 404 may be formed with respect to conductive structure 400.

Figure 4E:
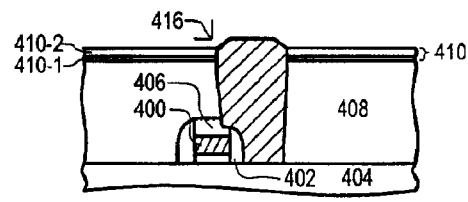
Figure 4F:
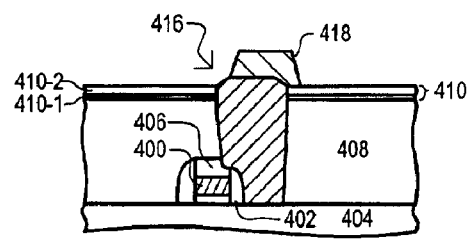

Following the formation of a contact hole 414 with a composite layer 410 as a hard etch mask, a contact structure may be formed (step 310). FIG. 4E shows a contact structure 416 formed within a contact hole 414. A contact structure 416 may include a conductive material and provide a conductive path between a substrate 404 and a subsequently formed conductive layer.

It is understood that while FIG. 4E illustrates a self-aligned contact to a substrate 404, a second embodiment may include other such contacts. Self-aligned contacts may be made to thin film transistors instead of transistors formed in a bulk silicon substrate, to name but one example.

It is also understood that a contact structure 416 may be formed in a variety of ways. To name but two examples, a conducting layer may be deposited and then patterned, or a conducting layer may be deposited and then chemically-mechanically polished and/or etched back to form a "plug" contact structure, A first interconnect structure may then be formed (step 312). A first interconnect structure may have the same general arrangement as the first interconnect structure 210 described in conjunction with FIG. 2E.

Figure 4G:
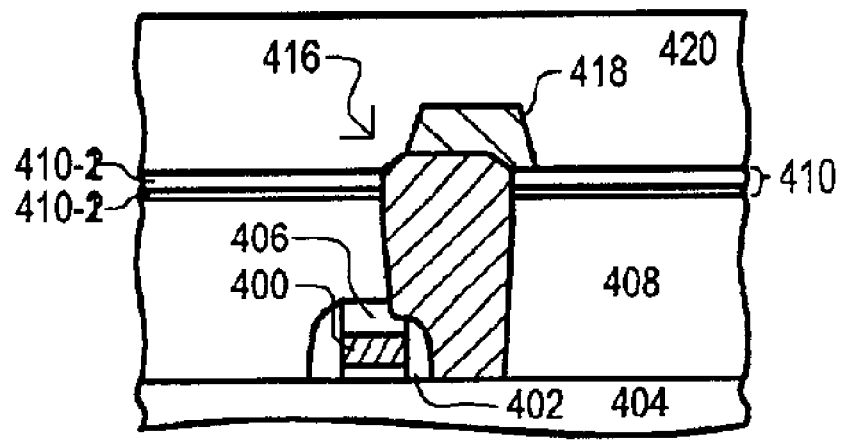

The second embodiment 300 may further include a forming a second insulating layer over a first interconnect structure (step 314). A resulting integrated circuit is shown in FIG. 4G, and includes a second insulating layer 420 formed over a first interconnect structure 418 and composite layer 410.

Figure 4H:
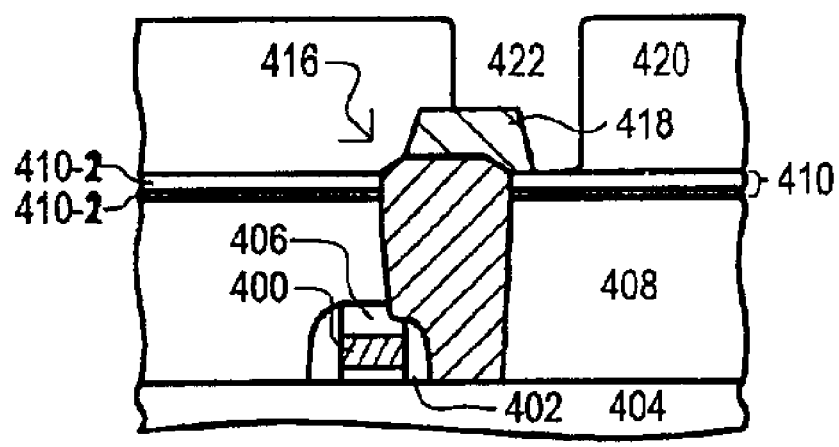

The second embodiment 300 may continue with a borderless contact pattern etch (step 316). As shown in FIG. 4H, a borderless contact pattern 422 may expose a first interconnect structure 418. As in the case of FIG. 2G, in the particular arrangement of FIG. 4H, a first composite material 410-1 in composite layer 410 may serve as an etch stop, etching at a slower rate than a second insulating layer 420.

In this way, composite layer 410 may serve as a hard contact etch mask, and as a borderless contact pattern etch stop.

Figure 5:
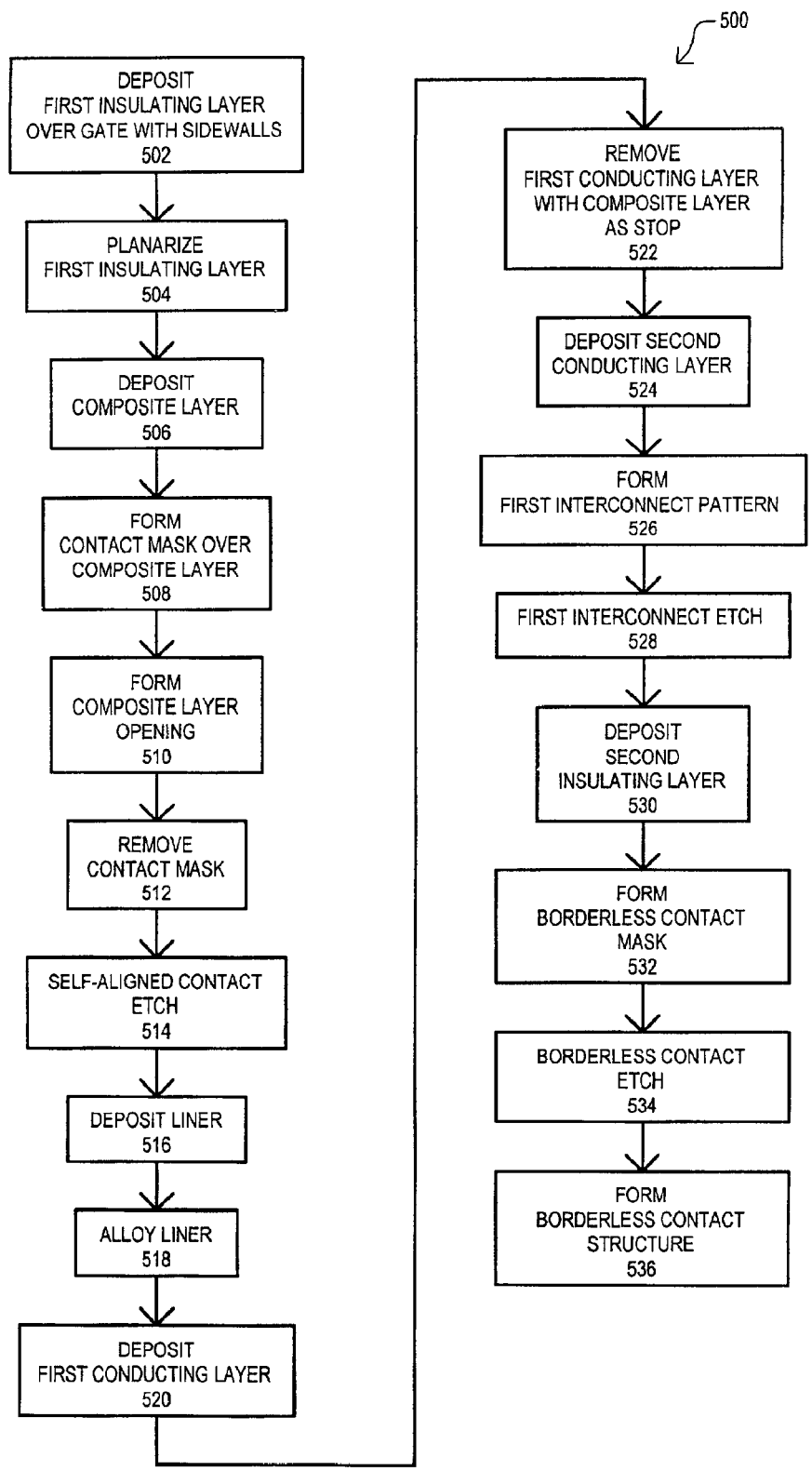
FIG. 5 is a flow diagram of a third embodiment.
Figure 6A:
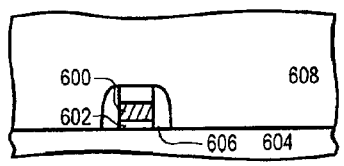
FIGS. 6A–6Q arc side cross sectional views of an integrated circuit formed according to the third embodiment.
Figure 6B:
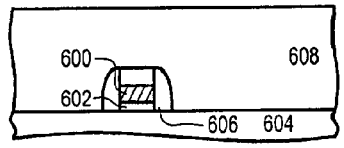
Figure 6C:
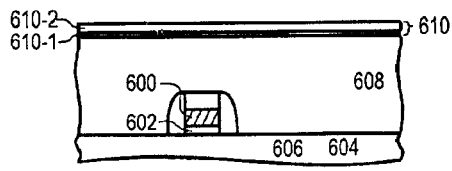
Figure 6D:
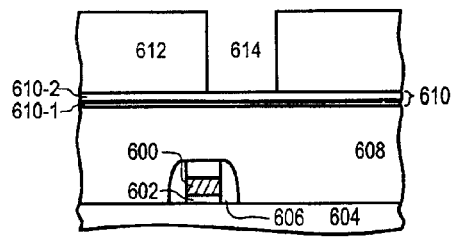
Figure 6E:
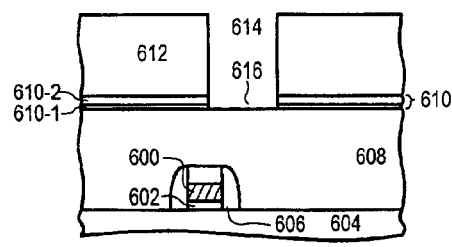
Figure 6F:
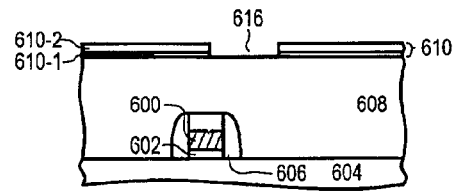
Figure 6G:
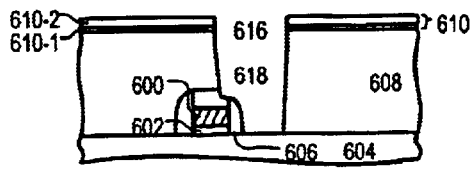
Figure 6H:
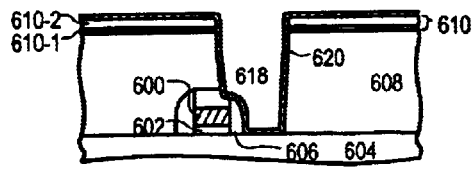
Figure 6I:
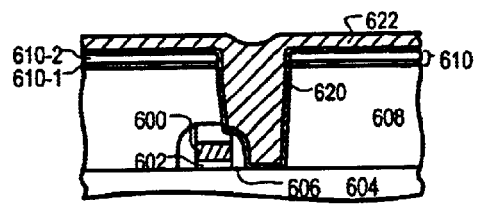
Figure 6J:
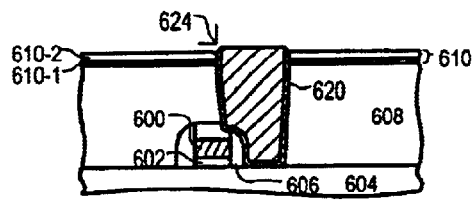
Figure 6K:
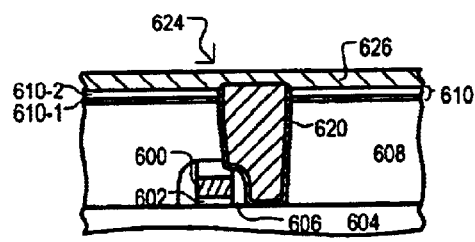
Figure 6L:
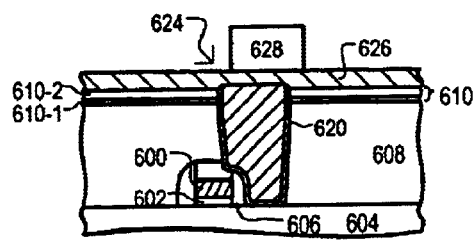
Figure 6M:
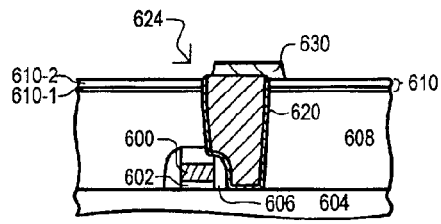
Figure 6N:
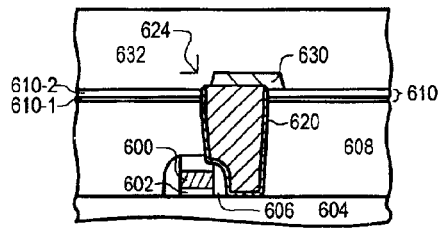
Figure 6O:
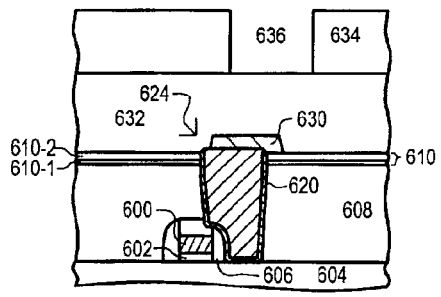
Figure 6P:
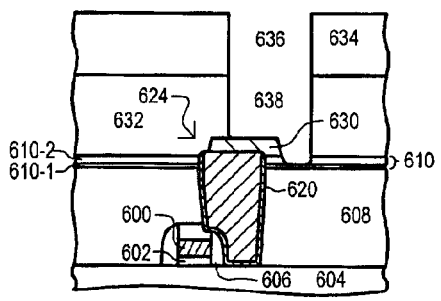
Figure 6Q:
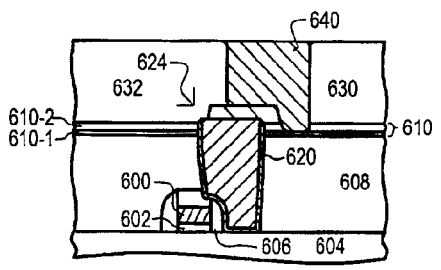
Figure 7A:
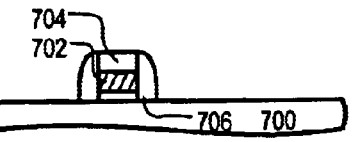
Figure 7B:
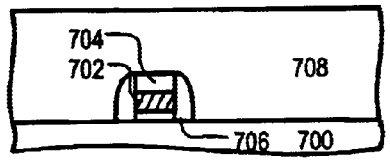
Figure 7C:
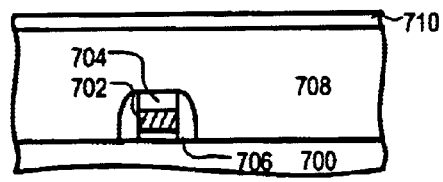
Figure 7D:
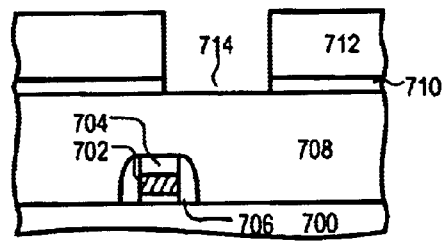
Figure 7E:
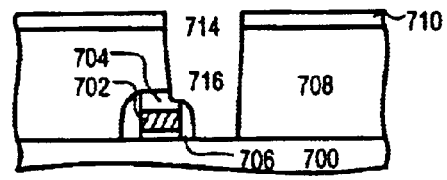
Figure 7F:
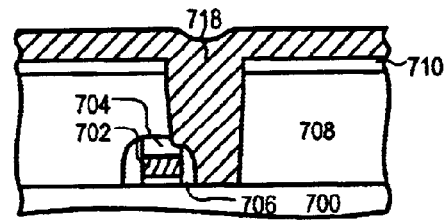

A third embodiment is shown in FIG. 5, designated by the general reference character 500. A number of cross sectional views are set forth in FIGS. 6A–6Q illustrating an integrated circuit formed according to the third embodiment 500.

A third embodiment 500 may include depositing a first insulating layer over a gate with sidewalls (step 502). In FIG. 6A, a gate 600 may be formed on a gate insulator 602 over a substrate 604. Sidewalls 606 may be formed on the sides of a gate 600. A gate 600 may form one part of an insulated gate field effect transistor.

A first insulating layer 608 may be formed over a gate 600. A first insulating layer 608 may include doped silicon dioxide. As just a two examples, a first insulating layer 608 may include silicon dioxide, more preferably silicon dioxide that is doped with phosphorous (phosphosilicate glass or "PSG"). Alternatively, a first insulating layer may be doped with boron and phosphorous (borophosphosilicate glass or "BPSG").

A first insulating layer may be deposited using chemical vapor deposition (CVD), or plasma enhanced or plasma assisted CVD (PECVD and PACVD), or high density plasma (HDP) deposition, to name but a few examples. A PSG or BPSG layer can be subject to a "reflow" and/or planarization step. BPSG and/or PSG may provide advantageous reflow and/or space filling properties.

It is understood that while a first insulating layer has been discussed as including a single material (e.g., BPSG or PSG), such a first insulating layer may include layers of different materials.

A first insulating layer 608 may be planarized after it is deposited (step 504). Planarization may include a chemical-mechanical polishing (CMP) step, as just one example. Alternatively, planarizing may be accomplished by an isotropic etching step, or by a relatively low temperature and/or short duration reflow step, but CMP is preferred. An integrated circuit following the planarization of a first insulating layer 608 is shown in FIG. 6B.

Once a first insulating layer 608 has been planarized, a third embodiment 500 can continue with a deposition of a composite layer over a first insulating layer 608 (step 506). Such a step 506 may include depositing a first composite layer material 610-1 on a first insulating layer 608. A first composite layer material 610-1 may include silicon nitride. Such a silicon nitride layer may have a thickness in the range of 1500 Å to 100 Å, preferably in the range of 1000 Å to 250 Å, more preferably about 500 Å. A step 506 may further include depositing a second composite layer material 610-2 on a first composite layer material 610-1. A second composite layer material 610-2 may include doped or undoped silicon dioxide, preferably undoped silicon dioxide (undoped silicate glass or USG). Such a USG layer may have a thickness in the range of 3000 Å to 250 Å, preferably in the range of 2000 Å to 500 Å, and more preferably about 1500 Å.

A silicon nitride layer in a composite layer may provide a different etch response than a silicon dioxide layer in a composite layer. As just one example, a silicon nitride layer may provide a high degree of selectivity to an "oxide" etch (an etch for removing silicon dioxide).

It is understood that while a composite layer 610 has been described that includes silicon dioxide and silicon nitride for a degree of etch selectivity, other materials may be used. As just two examples, a composite layer 610 may include a layer of silicon oxynitride and a layer of silicon dioxide, or a layer of silicon nitride and a layer of silicon oxynitride.

Silicon nitride may be formed by plasma enhanced chemical vapor deposition (PECVD) with silane ($SiH_4$) as a source of silicon and ammonia ($NH_3$), and/or nitrogen ($N_2$) and possibly nitrous oxide ($N_2O$) as a source of nitrogen, to name but a few examples.

Silicon oxynitride may be formed by PECVD with silane or dichlorosilane ($SiCl_2H_2$) as a source of silicon and nitrous oxide as a source of nitrogen and oxygen, to name but a few examples.

A USG layer may be formed by PECVD methods, with tetraorthoethylsilicate (TEOS) as a source material. Alternatively, a USG layer may be formed with silane or dichlorosilane as a source of silicon, and nitrous oxide or nitric oxide (NO) as sources of oxygen, to name but a few examples.

A composite layer 610 may serve as a "capping" layer for first insulating layer 608, preventing the migration of dopants from a first insulating layer and/or preventing moisture from migrating into a first insulating layer.

As shown in FIG. 5, a third embodiment 500 may continue by forming a contact mask over a composite layer (step 508). As shown in FIG. 6D, a step 508 may include forming a contact mask 612 having a contact mask opening 614 therein. In one particular approach, a contact mask 612 may include a layer of photoresist that is deposited and then developed. To provide favorable photolithographic results, a photoresist layer may also include an antireflective coating. A contact mask opening 614 may be situated over locations where a contact may be formed.

It is noted that a contact hole may be formed through a composite layer 610 and first insulating layer 608 with a contact mask 612 functioning as an etch mask. However, in the particular approach illustrated by FIGS. 6A to 6Q, a composite layer 610 may be a "hard" etch mask. Accordingly, the third embodiment 500 may include forming an opening in the composite layer (step 510). Such a step 510 may include etching through a composite layer 610. As just one example, an opening may be formed with a reactive ion etch (RIE). An RIE etch may be a single etch step with a recipe that does not include substantial selectivity between the materials of a composite layer 610. Alternatively, such an etch may include multiple etch steps that remove various composite layer 610 materials (such as 610-1 and 610-2) separately. An example of integrated circuit following a step 510 is shown in FIG. 6E, and includes a hard mask opening 616.

Using a hard mask in the place of a conventional mask of photoresist may result in advantageous improvements in contact aspect ratio. One approach illustrating such a hard mask is set forth in commonly-owned copending U.S. patent application Ser. No. 09/326,432, entitled METHOD AND STRUCTURE FOR MAKING SELF-ALIGNED CONTACTS, the contents of which are incorporated by reference herein.

After forming openings in a composite layer 610, a contact mask 614 may be removed (step 512). If a contact mask 614 is formed from photoresist, such a step may include removing the photoresist with a plasma etch ("ashing").

With a hard mask in place (formed from the composite layer 610), a third embodiment 500 may continue with a self-aligned contact etch (step 514). As shown in FIG. 6G, a self-aligned contact etch may form a contact hole 618 to a substrate 604 that is self-aligned with respect to a gate 600. A self-aligned contact etch, as just one example, may preferably include a substantially anisotropic RIE. Of course, other etch methods may be used in a self-aligned contact, such as a wet chemical etch, to name but one example.

In the particular method of FIG. 5, a conducting "liner" may be deposited (step 516). A conducting liner may be a material, or combination of materials, that can provide a diffusion barrier for a subsequently deposited material and/or provide a conductive layer that adheres to lower layers. A step 516 may include sputtering a layer of titanium (Ti), followed by a layer of titanium nitride (TiN), as just one example. FIG. 6H shows an integrated circuit following a conducting liner deposition. A conducting liner 620 may be formed over a composite layer 610 and into a contact hole 618, including an exposed portion of a substrate 604. A conducting liner 620 may then be alloyed to a substrate (step 518).

A first conducting layer may then be deposited (step 520). As shown in FIG. 6I, a first conducting layer 622 may fill a contact hole 618 and be formed over a composite layer 610. A first conducting layer 622 may include tungsten (W). A tungsten layer may be deposited with plasma vapor deposition (PVD) or CVD techniques using silane and tungsten hexaflouride ($WF_6$) as reactant gases, as just two examples.

Portions of a first conducting layer may then be removed with a composite layer as a stop (step 522). In the particular arrangement of FIG. 6J, a step 522 may include a CMP step. With composite layer 610 functioning as a stop, first conducting layer 622 may be removed exposing a composite layer 610 and forming a "plug" contact structure 624.

A third embodiment 500 may further include depositing a second conducting layer (step 524). As shown in FIG. 6K, a second conducting layer 626 may be formed over a composite layer 610 and a contact structure 624. A second conducting layer 626 may include titanium (Ti) as but one example. Such a titanium layer may preferably be formed by sputtering, as just one example.

A first interconnect mask may then be formed (step 524). As just one example, a first interconnect mask may be formed with conventional photolithographic and etch techniques. An integrated circuit following a step 524 is shown in FIG. 6L. A first interconnect mask portion 628 can be formed over a second conducting layer 626 where a first interconnect structure may be formed.

A first interconnect structure may then be etched (step 528). An etch step may remove portions of a second conducting layer to form a first interconnect structure. A first interconnect mask may then be removed. In FIG. 6M, a first interconnect structure is shown as item 630.

A third embodiment 500 may continue by depositing a second insulating layer (step 530). As shown in FIG. 6N, a second insulating layer; 632 may be formed over a composite layer 610 and contact structure 624. In one particular arrangement, a second insulating layer 632 may include silicon dioxide. Silicon dioxide may be formed by PECVD with tetraorthoethylsilicate (TEOS) as a source material. Alternatively, silicon dioxide may be formed with silane or dichlorosilane as a source of silicon, and nitrous oxide or nitric oxide (NO) as sources of oxygen, to name but a few examples.

A second insulating layer may be subsequently planarized according to conventional techniques, such as a chemical mechanical polishing and/or an etch back step, to name but two examples.

A borderless contact mask may then be formed over a second insulating layer (step 532). As shown in FIG. 6O, a borderless contact mask 634 may include pattern openings 636 corresponding to a desired contact pattern. A borderless contact mask 634 may be formed with conventional photolithographic techniques that develop a layer of photoresist. Alternate methods may include forming a "hard" mask, as just one example.

With a borderless contact mask in place, a borderless contact etch may take place (step 534). As shown in FIG. 6P, a borderless contact etch may remove exposed portions of a second insulating layer 632 and a borderless contact pattern 638 may be formed. A borderless contact etch may be selective between a portion of a composite layer 610 and a second insulating layer 632. As just one example, a second insulating layer 632 may include silicon dioxide while a composite layer 610 may include silicon nitride and/or silicon oxynitride. In such an arrangement, a borderless contact etch may be an oxide (i.e., silicon dioxide) etch.

With a borderless contact pattern formed in a second insulating layer, a borderless contact structure may be formed (step 536). As shown in FIG. 6Q, a borderless contact pattern may be removed, and a third conducting layer may be deposited into a borderless contact pattern 638. In one particular arrangement, a third conducting layer may include aluminum, deposited by sputtering and/or plasma enhanced chemical vapor deposition techniques. Portions of a third conducting layer may then be removed, by way of an etch back step and/or a chemical-mechanical polishing step, to name but two examples. A borderless contact structure 640 may be coupled to a first interconnect structure 630 and/or a contact structure 624.

It is understood that in the particular arrangement illustrated by FIG. 6Q, a borderless contact structure 640 is not a contact or via, but may include a conductive line extending through a second insulating layer 632 that is connected to one or more first interconnect structures (such as 630). Further, while the arrangement of FIGS. 6A to 6Q illustrates a borderless contact structure formed with a single etch step, other borderless contact structures may be formed. As just one example, a borderless contact pattern may be formed with multiple etch steps and/or include integral contacts and/or vias. A conventional "dual damascene" borderless contact arrangement is but one example of such an alternate arrangement.

In this way, a third embodiment 500 may include a composite layer that may be a capping layer for an underlying insulating layer, a hard etch mask for an underlying insulating layer, a stop layer for a conducting layer removal step (such as CMP), and a stop layer for a borderless contact pattern etch.

A structure formed according to the various embodiments may include a first insulating layer, an intermediate layer (such as a composite layer), and a second insulating layer formed over the intermediate layer. A contact or via structure may extend through a first insulating layer and intermediate layer. An intermediate layer may include a material that may function as a removal stop (such as a CMP stop or etch back stop).

A structure formed according to the various embodiments may further include a borderless contact structure that extends through a second insulating layer and has a conductive connection to a contact or via. An intermediate layer may further include a material having different etch properties than a second insulating layer and may function as an etch stop for a borderless contact pattern formed in the second insulating layer.

It is understood that while the various particular embodiments have been set forth herein, methods and structures according to the present invention could be subject to various changes, substitutions, and alterations without departing from the spirit and scope of the invention.

What is claimed is:

1. A method, comprising:
   forming a stop layer;
   forming a contact with chemical-mechanical polishing that removes a conductive layer with the stop layer as a conductive layer removal stop; and
   performing a borderless contact etch with the stop layer as an etch stop in the borderless contact etch.

2. The method of claim 1, wherein:
   the borderless contact etch includes a reactive ion etch.

3. The method of claim 1, wherein:
   the stop layer is a composite layer that includes at least two different materials.

4. The method of claim 3, wherein:

the stop layer includes a layer comprising silicon dioxide and a layer comprising silicon nitride.

5. The method of claim 3, wherein:

the stop layer includes layer comprising silicon dioxide and a layer comprising silicon oxynitride.

6. The method of claim 3, wherein:

the stop layer includes a layer comprising silicon oxynitride and a layer comprising silicon nitride.

7. The method of claim 3, wherein:

the stop layer includes a first layer that is less than 1500 angstroms thick and a second layer that is less than 1500 angstroms thick.

8. A method, comprising:

removing a first conducting layer formed over a stop layer having a contact hole formed therein, with the stop layer as a removal stop to form a contact structure;

forming a conducting interconnect structure after removing the first conducting layer, the conducting interconnect structure contacting the contact structure; and etching a borderless contact pattern into an insulating layer formed over the stop layer, with the stop layer as an etch stop, the borderless contact pattern exposing at least a portion of the conducting interconnect structure.

9. The method of claim 8, wherein:

removing a first conducting layer includes chemical-mechanical polishing.

10. The method of claim 8, wherein:

the insulating layer includes silicon dioxide; and the stop layer includes a layer of $Si_XN_YO_Z$, where X and Y are integers greater than zero and Z is an integer that can include zero.

11. The method of claim 10, wherein:

the stop layer further includes a layer of silicon dioxide.

12. A method, comprising:

forming a stop layer between a first insulating layer and a second insulating layer having a substantially slower removal rate than a conducting material in a step that removes essentially all of the conducting material above a top surface of the stop layer to expose the stop layer and retains the conducting material below the top surface of the stop layer to form a contact in the first insulating layer, the stop layer having a substantially slower removal rate than the second insulating material in an etch step that forms a borderless contact pattern in the second insulating layer.

13. The method of claim 12, wherein:

the conductive material removal step includes chemical-mechanical polishing.

14. The method of claim 12, wherein:

a conducting material includes a metal and the stop layer includes $Si_XN_YO_Z$, where X and Z are integers greater than zero and Y is an integer that can include zero.

15. The method of claim 14, wherein:

a second insulating layer includes silicon dioxide and the stop layer further includes silicon nitride.

16. The method of claim 12, wherein:

the first insulating layer includes silicon dioxide having a concentration of phosphorous dopant that is greater than 5% by weight.

17. The method of claim 16, wherein:

the stop includes a layer of substantially undoped silicon dioxide.

* * * * *